(12) United States Patent
Saido et al.

(10) Patent No.: US 10,731,254 B2
(45) Date of Patent: Aug. 4, 2020

(54) PROTECTIVE PLATE, SUBSTRATE PROCESSING APPARATUS, AND METHOD OF MANUFACTURING SEMICONDUCTOR DEVICE

(71) Applicant: KOKUSAI ELECTRIC CORPORATION, Tokyo (JP)

(72) Inventors: Shuhei Saido, Toyama (JP); Hidenari Yoshida, Toyoma (JP); Yusaku Okajima, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 16/748,607

(22) Filed: Jan. 21, 2020

(65) Prior Publication Data
US 2020/0165722 A1 May 28, 2020

Related U.S. Application Data

(63) Continuation of application No. PCT/JP2018/012088, filed on Mar. 26, 2018.

(30) Foreign Application Priority Data

Aug. 30, 2017 (JP) ................................ 2017-165477

(51) Int. Cl.
*C23C 16/458* (2006.01)
*C23C 16/455* (2006.01)
(Continued)

(52) U.S. Cl.
CPC ...... *C23C 16/4582* (2013.01); *C23C 16/4401* (2013.01); *C23C 16/4408* (2013.01);
(Continued)

(58) Field of Classification Search
CPC .......... C23C 16/4582; C23C 16/45563; C23C 16/4412; C23C 16/45578; C23C 16/4401;
(Continued)

(56) References Cited

U.S. PATENT DOCUMENTS 10,529,607 B2 * 1/2020 Ito ........................... C23C 16/50
10,593,572 B2 * 3/2020 Saido ................ H01L 21/67309
(Continued)

FOREIGN PATENT DOCUMENTS

| JP | 2002-009010 A | 1/2002 |
|----|---------------|--------|
| JP | 2006-269646 A | 10/2006 |
| JP | 2006-310857 A | 11/2016 |
| WO | 2017/037937 A1 | 4/2018 |

OTHER PUBLICATIONS

International Search Report, PCT/JP2018/012088, dated Jun. 19, 2018, 2 pgs.

*Primary Examiner* — Jeffrie R Lund
(74) *Attorney, Agent, or Firm* — Volpe and Koenig, P.C.

(57) ABSTRACT

There is provided a technique that includes a protective plate installed on a lid, including: a disc portion, of which a lower surface is in contact with an upper surface of the lid, a side wall portion extending from an outer peripheral end of the disc portion, a groove formed in the lower surface of the disc portion, and a stepped portion formed to be closer to the outer peripheral end of the disc portion than the groove, a clearance formed between the upper surface of the lid and the stepped portion, wherein the groove is configured to be able to form a flow of a gas that runs through a gap between the lid and the stepped portion, and is supplied to an outside of the side wall portion.

10 Claims, 9 Drawing Sheets

(51) Int. Cl.
 *C23C 16/44* (2006.01)
 *H01J 37/32* (2006.01)
 *H01L 21/02* (2006.01)
 *H01L 21/67* (2006.01)
 *H01L 21/31* (2006.01)

(52) U.S. Cl.
 CPC .... *C23C 16/4412* (2013.01); *C23C 16/45563* (2013.01); *C23C 16/45578* (2013.01); *H01J 37/32458* (2013.01); *H01L 21/02263* (2013.01); *H01L 21/31* (2013.01); *H01L 21/67098* (2013.01)

(58) Field of Classification Search
 CPC .......... C23C 16/4408; H01L 21/02263; H01L 21/67098; H01L 21/31; H01J 37/32458
 See application file for complete search history.

(56) References Cited

U.S. PATENT DOCUMENTS

| | | |
|---|---|---|
| 2006/0243269 A1 | 11/2006 | Berenbak et al. |
| 2015/0227602 A1 | 8/2015 | Ramu et al. |
| 2017/0088948 A1 | 3/2017 | Takagi et al. |
| 2017/0294318 A1 | 10/2017 | Yoshida et al. |
| 2017/0335452 A1 | 11/2017 | Yamazaki et al. |
| 2018/0033645 A1* | 2/2018 | Saido ............... H01L 21/67772 |
| 2018/0187307 A1* | 7/2018 | Yoshida ................ C23C 16/345 |
| 2019/0071777 A1* | 3/2019 | Yoshida ................ C23C 16/345 |
| 2019/0279877 A1* | 9/2019 | Murakami .............. C23C 16/52 |
| 2019/0287829 A1* | 9/2019 | Saido ............... H01L 21/67109 |
| 2019/0287830 A1* | 9/2019 | Saido ........................ F27B 9/30 |
| 2020/0043763 A1* | 2/2020 | Yoneda ............ H01L 21/67288 |
| 2020/0066551 A1* | 2/2020 | Okajima .......... H01L 21/67126 |
| 2020/0090965 A1* | 3/2020 | Miyashita ......... H01L 21/67109 |

* cited by examiner

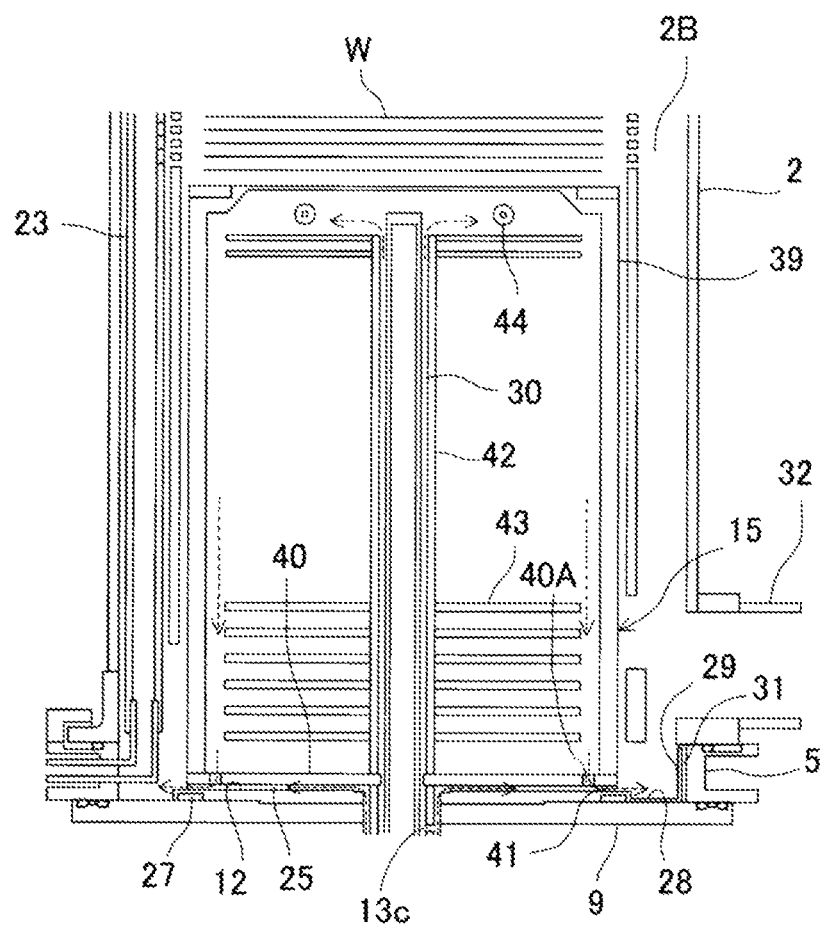

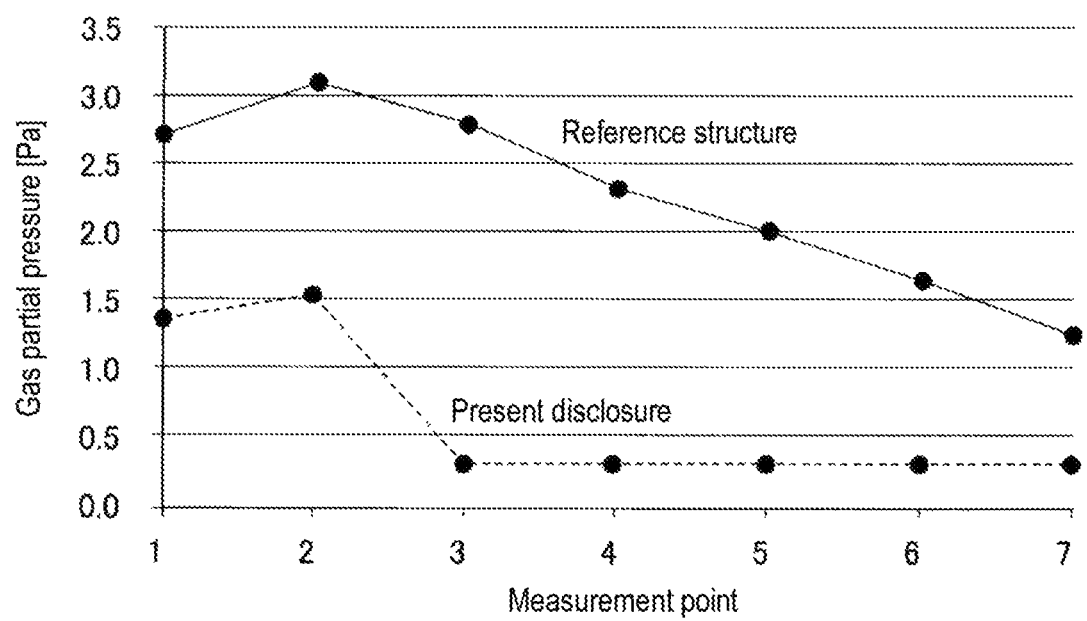

PROTECTIVE PLATE, SUBSTRATE PROCESSING APPARATUS, AND METHOD OF MANUFACTURING SEMICONDUCTOR DEVICE

CROSS-REFERENCE TO RELATED APPLICATION

This application is a Bypass Continuation Application of PCT International Application No. PCT/JP2018/012088, filed on Mar. 26, 2018, the entire contents of which are incorporated herein by reference.

TECHNICAL FIELD

The present disclosure relates to a protective plate used for a process such as forming a thin film or the like on a substrate, a substrate processing apparatus, and a method of manufacturing a semiconductor device.

BACKGROUND

There is a vertical substrate processing apparatus as a substrate processing apparatus that performs substrate processing in a process of manufacturing a semiconductor device. In the vertical substrate processing apparatus, a plurality of substrates are stacked and held in multiple stages, loaded into a process chamber, and processed at once.

During the processing, a furnace port at the lower portion of the process chamber can be the coldest in the process chamber. When a precursor gas diffuses to the furnace port, reaction by-products of the precursor gas adhere to the furnace port, which may cause a generation of particles. There has been conventionally proposed a substrate processing apparatus that supplies a purge gas to a furnace port having a high process gas concentration so as to suppress adhesion of by-products to metal parts.

However, in some types of substrate processing apparatuses, a dilution of the precursor gas is insufficient due to a configuration of the furnace port, and by-products by the precursor gas may adhere to the furnace port. In particular, when metal parts are used in the furnace port, by-products tend to adhere to the metal parts. For this reason, even as cleanings are performed more frequently, particles may be generated.

SUMMARY

The present disclosure provides some embodiments of a protective plate, a substrate processing apparatus, and a method of manufacturing a semiconductor device, which are capable of suppressing adhesion of by-products by a precursor gas to a furnace port.

According to one or more embodiments of the present disclosure, there is provided a technique that includes a protective plate installed on a lid including: a disc portion having a disc shape, wherein at least a part of a lower surface of the disc portion is in contact with an upper surface of the lid, a side wall portion extending vertically from an outer peripheral end of the disc portion, a groove having a loop shape and formed in the lower surface of the disc portion, and a stepped portion formed to be closer to the outer peripheral end of the disc portion than the groove, a predetermined clearance being formed between the upper surface of the lid and the stepped portion, wherein the groove is configured to be able to form a flow of a gas that runs through a gap between the lid and the stepped portion, and is supplied to an outside of the side wall portion.

BRIEF DESCRIPTION OF DRAWINGS

FIG. 2 is a vertical cross sectional view showing a furnace port of the substrate processing apparatus.

FIG. 8 is a graph showing a comparison between the process gas concentration distribution in the furnace port of the first embodiments and the process gas concentration distribution in the furnace port having the reference structure.

DETAILED DESCRIPTION

Figure 1:
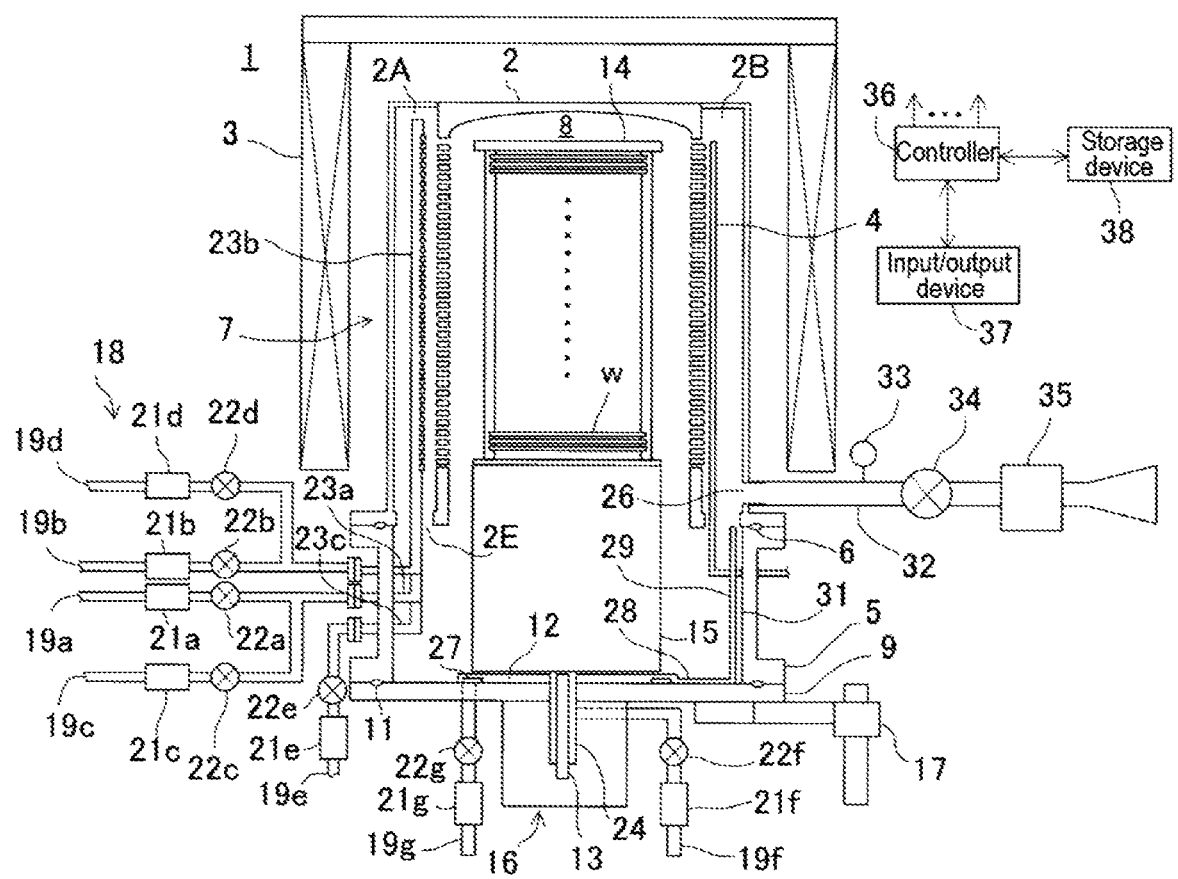
FIG. 1 is a vertical cross sectional view showing a substrate processing apparatus according to first embodiments of the present disclosure.

Embodiments of the present disclosure will now be described with reference to the drawings. Throughout the drawings, the same or corresponding components are denoted by the same or corresponding reference numerals, and explanation thereof may be omitted.

First embodiments may include a substrate processing apparatus which is a vertical substrate processing apparatus (hereinafter referred to as a "processing apparatus") 1 that performs a substrate processing process such as heat treatment or the like as a manufacturing process in a method of manufacturing a semiconductor device.

As shown in FIG. 1, the processing apparatus 1 includes a reaction tube 2 having a cylindrical shape and a heater 3 as a heating mechanism (heating means) installed on the outer periphery of the reaction tube 2. The reaction tube 2 is made of, for example, quartz (SiO), silicon carbide (SiC), or the like. A temperature detector 4 is installed in the reaction tube 2. The temperature detector 4 is erected along the inner wall of the reaction tube 2.

A manifold 5 having a cylindrical shape is connected to the lower end opening of the reaction tube 2 via a seal member 6 such as an O-ring or the like so as to support the lower end of the reaction tube 2. The manifold 5 is made of metal such as stainless steel or the like. A process vessel 7 is formed by the reaction tube 2 and the manifold 5. A process chamber 8 in which wafers W as substrates are processed is formed inside the process vessel 7.

In addition, the reaction tube 2 is formed with a supply buffer chamber 2A and an exhaust buffer chamber 2B facing each other so as to protrude outward (in the radial direction). The supply buffer chamber 2A and the exhaust buffer chamber 2B are partitioned into a plurality of spaces by partition walls. A nozzle 23a, a nozzle 23b, and a nozzle 23c (which will be described later) are installed in the respective spaces of the supply buffer chamber 2A. A boundary wall between the supply buffer chamber 2A and the exhaust buffer chamber 2B and the process chamber 8 is formed to have the same inner diameter as the inner diameter of the reaction tube at a location where the supply buffer chamber 2A and so on are not installed, and a plurality of slits in fluid communication with both sides are installed. An opening 2E for inserting or removing the nozzle 23a, the nozzle 23b, and the nozzle 23c is formed in a lower portion of the inner wall of the supply buffer chamber 2A. The opening 2E is formed to have substantially the same width as the supply buffer chamber 2A. Here, since it is difficult to eliminate the gaps between the opening 2E and the bases of the nozzle 23a, the nozzle 23b and the nozzle 23c, it is difficult to prevent a reaction gas or the like from flowing out of the gaps.

The lower end opening of the manifold 5 (the lower end opening of the process vessel 7) is opened/closed by a lid 9 having a disc shape. The lid 9 is made of, for example, metal. A seal member 11 such as an O-ring or the like is installed on the upper surface of the lid 9, and the reaction tube 2 is hermetically sealed from the outside air by the seal member 11. A protective plate 12 as a lid cover to be described later is installed on the upper surface of the lid 9. A hole is formed in the center of the lid 9, and a rotary shaft 13 to be described later is inserted through the hole. In order to protect the seal member 6 and the seal member 11, they may be kept at 200 degrees C. or less, and a water jacket (not shown) can be attached to the flanges of the reaction tube 2 or the manifold 5.

The process chamber 8 stores therein a boat 14 as a substrate holder for supporting a plurality of wafers W, for example, 25 to 150 wafers W, vertically in a shelf shape. The boat 14 is made of, for example, quartz, SiC, or the like, and is supported above a heat-insulating structure 15.

The heat-insulating structure 15 has an outer shape of cylinder with a generally flat bottom and is supported by the rotary shaft 13 that penetrates the lid 9. The rotary shaft 13 is connected to a rotation mechanism 16 installed below the lid 9. For example, a magnetic fluid seal is installed at a portion of the rotary shaft 13 that penetrates the lid 9, and the rotary shaft 13 is configured to be rotatable in a state where the interior of the reaction tube 2 is hermetically sealed. When the rotary shaft 13 is rotated, the heat-insulating structure 15 and the boat 14 are rotated together. The lid 9 is driven in the vertical direction by a boat elevator 17 as an elevator. The substrate holder and the lid 9 are integrally moved up or down by the boat elevator 17, so that the boat 14 is loaded/unloaded into/from the reaction tube 2.

The processing apparatus 1 includes a gas supply mechanism 18 that supplies a precursor gas as a process gas to be used for substrate processing, a reaction gas, and an inert gas into the process chamber 8. The process gas supplied by the gas supply mechanism 18 is selected according to the type of a film to be formed. In the first embodiments, the gas supply mechanism 18 includes a precursor gas supplier, a reaction gas supplier, an inert gas supplier, a first purge gas supplier, and a second purge gas supplier.

The precursor gas supplier includes a gas supply pipe 19a. A mass flow controller (MFC) 21a, which is a flow rate controller (flow rate control part), and a valve 22a, which is an opening/closing valve, are installed in the gas supply pipe 19a in order from an upstream direction. A downstream end of the gas supply pipe 19a is connected to the nozzle 23a that penetrates the side wall of the manifold 5. The nozzle 23a is vertically installed in the reaction tube 2 along the inner wall of the reaction tube 2, and has a plurality of supply holes formed to open toward the wafers W held by the boat 14. A precursor gas is supplied to the wafers W through the supply holes of the nozzle 23a.

Hereinafter, with the same configuration, a reaction gas is supplied to the wafers W from the reaction gas supplier via a gas supply pipe 19b, an MFC 21b, a valve 22b, and the nozzle 23b. An inert gas is supplied to the wafers W from the inert gas supplier via gas supply pipes 19c, 19d and 19e, MFCs 21c, 21d and 21e, valves 22c, 22d and 22e, and the nozzles 23a, 23b and 23c.

The first purge gas supplier (supply mechanism) includes a gas supply pipe 19f. An MFC 21f and a valve 22f are installed in the gas supply pipe 19f in order from an upstream direction. A downstream end of the gas supply pipe 19f is connected to a hollow portion 24 formed around the rotary shaft 13. The hollow portion 24 is sealed in front of a bearing by a magnetic fluid seal, and is opened to the upper end, that is, to the interior of the reaction tube 2. In addition, a space communicating from the hollow portion 24 to the upper surface of the protective plate 12 is formed, and the space is continuous with a gap 41 (which will be described, see FIG. 2) formed between the heat-insulating structure 15 and the protective plate 12 and forms a first purge gas flow path 25 (see FIG. 2).

The second purge gas supplier (supply mechanism) includes a gas supply pipe 19g. An MFC 21g and a valve 22g are installed in the gas supply pipe 19g in order from an upstream direction. A downstream end of the gas supply pipe 19g penetrates the lid 9, and a second purge gas supply port is formed on the upper surface of the lid 9. Accordingly, the second purge gas supply port is formed on the upper surface of the lid 9 and opens to a second purge gas flow path 27. The opening position of the second purge gas supply port is in the vicinity of the nozzles 23a, 23b and 23c (see FIG. 3B). A flexible pipe such as a bellows pipe is used for the gas supply pipe 19a between the valve 22g and the second purge gas supply port. The second purge gas flow path 27 has substantially an annular shape (loop shape) and is formed over the entire circumference of the lower surface of the protective plate 12.

An exhaust pipe 32 is attached to an exhaust port 26 of the manifold 5. A vacuum pump 35, which is a vacuum exhaust device, is connected to the exhaust pipe 32 via a pressure sensor 33, which is a pressure detector (pressure detection part) for detecting the internal pressure of the process chamber 8, and an APC (Auto Pressure Controller) valve 34 which is a pressure regulator (pressure regulation part). With this configuration, the internal pressure of the process chamber 8 can be set to a processing pressure corresponding to the processing. The exhaust pipe 32 is installed at a position facing the nozzles 23a, 23b, and 23c.

The rotation mechanism 16, the boat elevator 17, and the MFCs 21a to 21g, valves 22a to 22g and APC valve 34 of the gas supply mechanism 18 are connected to a controller 36 for controlling them. The controller 36 includes, for example, a microprocessor (computer) including a CPU, and is configured to control the operation of the processing apparatus 1. For example, an input/output device 37 configured as a touch panel or the like is connected to the controller 36.

A storage device 38, which is a storage medium, is connected to the controller 36. The storage device 38 stores, in a readable manner, a control program for controlling the operation of the processing apparatus 1, and a program (also referred to as a recipe) that causes each component of the processing apparatus 1 to execute a process in accordance with processing conditions.

The storage device 38 may be a memory device (hard disk or flash memory) built in the controller 36, or a portable external recording device (a magnetic tape, a magnetic disk such as a flexible disk or a hard disk, an optical disk such as a CD or DVD, a magneto-optical disk such as an MO, or a semiconductor memory such as a USB memory or a memory card). Further, the program may be provided to the computer using a communication means such as the Internet or a dedicated line. The program is read from the storage device 38 according to an instruction or the like from the input/output device 37 as necessary, and the controller 36 executes a process according to the read recipe to cause the processing apparatus 1 to execute a desired process under control of the controller 36.

The protective plate 12 installed on the upper surface of the lid 9 is made of a heat-resistant and corrosion-resistant material such as quartz or the like. When the protective plate 12 covers the metal lid 9, the contact of a process gas to the lid 9 is suppressed, and corrosion and deterioration of the lid 9 due to the process gas are accordingly suppressed.

FIG. 2 shows the internal structure of a furnace port and the heat-insulating structure 15. The heat-insulating structure 15 includes a cylindrical body 39 having a columnar shape and a bottom plate 40 made of metal and having a disc shape supported by the rotary shaft 13. The cylindrical body 39 is made of a heat-resistant material such as quartz or the like, has a hollow structure with its lower end opened, and is placed on the bottom plate 40. In addition, a heat-insulating plate support pillar 42 having a hollow cylindrical shape is installed on the bottom plate 40 in the cylindrical body 39.

The heat-insulating plate support pillar 42 holds disc-shaped heat-insulating plates 43 made of a heat-resistant material such as quartz or the like, which are stacked in multi-stage. A sub-heater 44 is inserted into the heat-insulating plate support pillar 42. The sub-heater 44 has a ring shape above the heat-insulating plate support pillar 42, and the upper surface of the cylindrical body 39 and the lower portion of the process chamber 8 are heated by the sub-heater 44. The rotary shaft 13 also has a hollow structure in order to insert the sub-heater 44, and a third purge gas branched from a first purge gas is introduced into the rotary shaft 13 through a through hole 13c installed in a side portion of the rotary shaft 13 near a magnetic seal.

After the first purge gas supplied from the first purge gas supplier ascends over the outer periphery of the rotary shaft 13, the first purge gas changes its course horizontally, and is supplied to the lower portion of the process vessel 7, which is the furnace port, while purging the gap 41, which is narrow, between the bottom plate 40 and the protective plate 12. That is, the first purge gas purges the periphery of the rotary shaft 13 in the upstream, then purges the exposed surface of the protective plate 12 and the bases of the nozzles 23a to 23c in the downstream, and finally is discharged through the exhaust port 26 formed at the lower end of the reaction tube 2. In some embodiments, a supply path of the first purge gas supplied from the first purge gas supply mechanism may exclude a side wall portion 29.

The protective plate 12 has a first thin portion 28 formed to extend to the vicinity of the manifold 5 except for the location where the nozzles 23a, 23b and 23c are disposed. In addition, the side wall portion 29 extending vertically along the inner wall of the manifold 5 is formed at the outer peripheral end of the first thin portion 28. A clearance having a predetermined interval is formed between the first thin portion 28 and the lid 9, and a clearance 31 having a predetermined interval is also formed between the side wall portion 29 and the manifold 5.

A second purge gas supplied to the second purge gas flow path 27 flows out from the second purge gas flow path 27 in the radial direction, purges the back surface of the protective plate 12 and the inner surface of the manifold 5 while passing through the clearance 31, and then is discharged through the exhaust port 26.

The third purge gas branched from the first purge gas in the hollow portion 24 is introduced into the heat-insulating structure 15 through a gap between the rotary shaft 13 and the sub-heater 44 and a gap between the heat-insulating plate support pillar 42 and the sub-heater 44. These gaps form a third purge gas flow path 30. In addition, as discharge holes of the third purge gas, a plurality of openings 40A are formed at, for example, an equiangular pitch in the bottom plate 40. The third purge gas is supplied through the third purge gas flow path 30 into the cylindrical body 39 from the upper end of the heat-insulating plate support pillar 42. The third purge gas in the cylindrical body 39 descends along the inner peripheral surface of the cylindrical body 39, is discharged through the openings 40A, merges with the first purge gas, and is released into the furnace port. In the course of releasing the third purge gas into the furnace port, the interior of the cylindrical body 39 is purged. The conductance of each flow path is designed so that the flow rate of the third purge gas is higher than that of the first purge gas. The purge gas may be any gas that does not react with the precursor gas or the reaction gas.

Figure 6A:
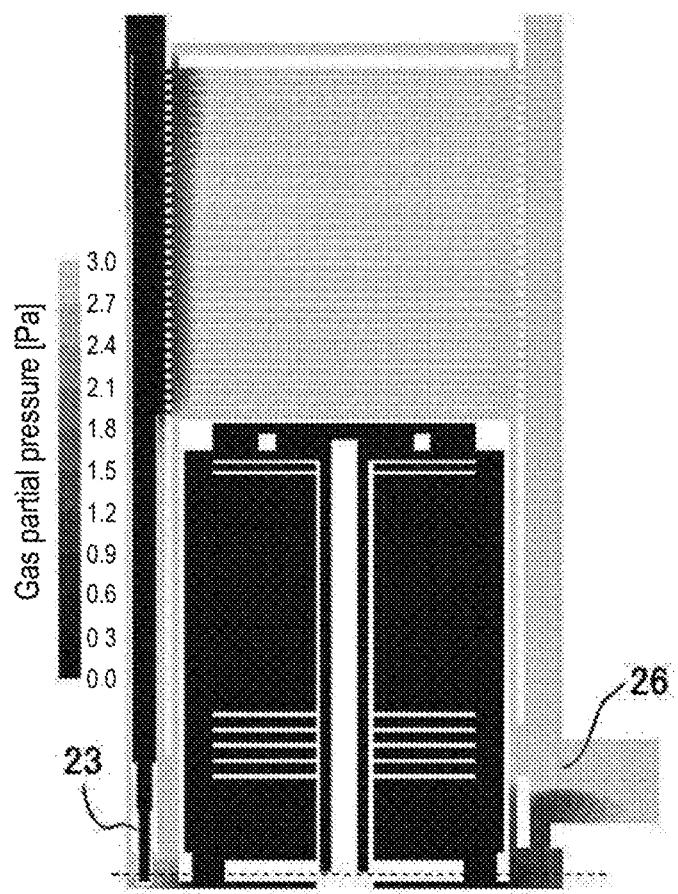
FIG. 6A is a vertical cross sectional view showing a process gas concentration distribution in the furnace port having a reference structure.
Figure 6B:
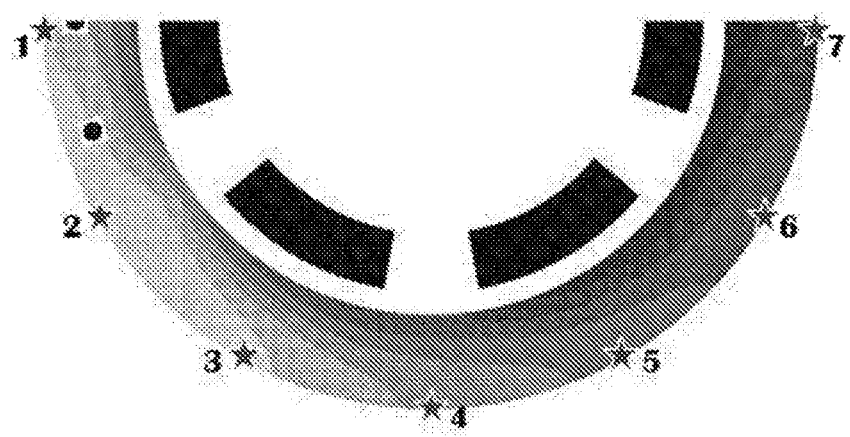
FIG. 6B is a cross sectional view showing the process gas concentration distribution in the furnace port having the reference structure.

Next, the concentration (partial pressure) of a process gas at the furnace port will be described. FIGS. 6A and 6B show a process gas concentration (gas partial pressure) distribution in a reference furnace port, that is, a furnace port for which purge with the second purge gas 54 (which will be described later) is not performed. As shown in FIGS. 6A and 6B, in the case of the reference configuration, it was found that the process gas concentration was high at a portion (nozzle 23 side) of the bases of the nozzles 23a to 23c located on the opposite side (opposing side) of the exhaust port 26 in the furnace port. Further, it was confirmed that the adhesion of by-products was noticeable at the portion of the bases of the nozzles 23a to 23c.

The process gas concentration in the inner peripheral surface of the manifold 5 at this time was 2.5 Pa or more for the nozzle 23 side, and 1 Pa or less for the opposite side (exhaust port 26 side) of the nozzle 23. That is, substantially no by-product was observed in the exhaust port 26 side. The temperature of the manifold is almost constant over the entire circumference, and is about 200 degrees C. Thus, when the process gas concentration in the furnace port is set to a value (for example, 1 Pa) lower than a critical value (a value between 1 and 2.5 Pa, for example, 2 Pa) at which no by-product is generated, it is thought that adhesion of by-products to the furnace port can be sufficiently suppressed.

The reason why the process gas concentration in the exhaust port 26 side is low is considered to be that the purge gas easily flows toward the exhaust port 26. On the other hand, since it is difficult to sufficiently supply the purge gas to the nozzles 23a to 23c side as much as the purge gas flows to the exhaust port 26, it is considered that the process gas concentration in the nozzles 23a to 23c side is high. Accordingly, by supplying the purge gas at a sufficient flow rate to the nozzles 23a to 23c side to sufficiently dilute the process gas on the nozzles 23a to 23c side, it is considered that the process gas concentration in the nozzle 23 side can have a value lower than the critical value at which no by-product is generated.

The process gas concentration in the furnace port decreases as the flow rate of the purge gas increases. However, when the flow rate of the purge gas is higher than a certain critical value (for example, higher than 500 sccm), it has been found that the purge gas of the furnace port reaches a wafer processing region, which may adversely affect a film-forming process (for example, inter-surface uniformity). In order to maintain the quality of the film-forming process, the purge gas flow rate may be 500 sccm or less. However, in this case, it has been found that the process gas concentration in the furnace port has a critical value (for example, 1 Pa) or more, and by-products may adhere to the furnace port. Here, the inter-surface uniformity means processing uniformity for each substrate. For example, this means that a substrate positioned in the lower portion of the boat 14 has substantially the same processing state as a substrate positioned in the upper portion of the boat 14.

Therefore, the inventors have found that adhesion of by-products in the entire furnace port can be suppressed without adversely affecting the film-forming process by increasing the flow rate of the purge gas supplied to portions where the process gas concentration is high and the by-products are likely to adhere, for example, the bases and peripheral portions of the nozzle 23a to 23c of the furnace port, more than the other portions, that is, by increasing the flow rate of the purge gas locally. In addition, the inventors have found that adhesion of by-products can be suppressed by supplying most of the first purge gas 53 to the bases and peripheral portions of the nozzles 23a to 23c and supplying the second purge gas 54 to the other parts along the inner wall surface of the manifold 5 and by intensively supplying the purge gas to a portion where the process gas concentration is high while supplying the purge gas to the other portions, while suppressing the purge gas flow rate below a critical value.

Figure 3A:
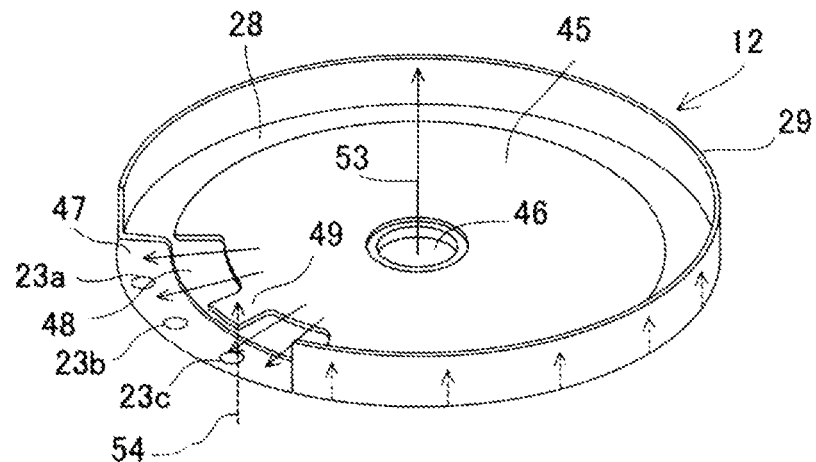
FIG. 3A is a plan perspective view showing a protective plate used in the substrate processing apparatus.
Figure 3B:
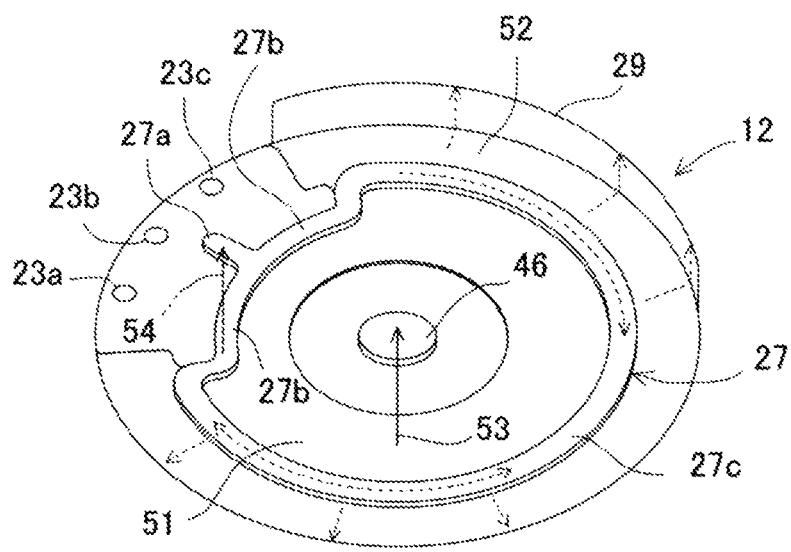
FIG. 3B is a bottom perspective view showing the protective plate.
Figure 4A:
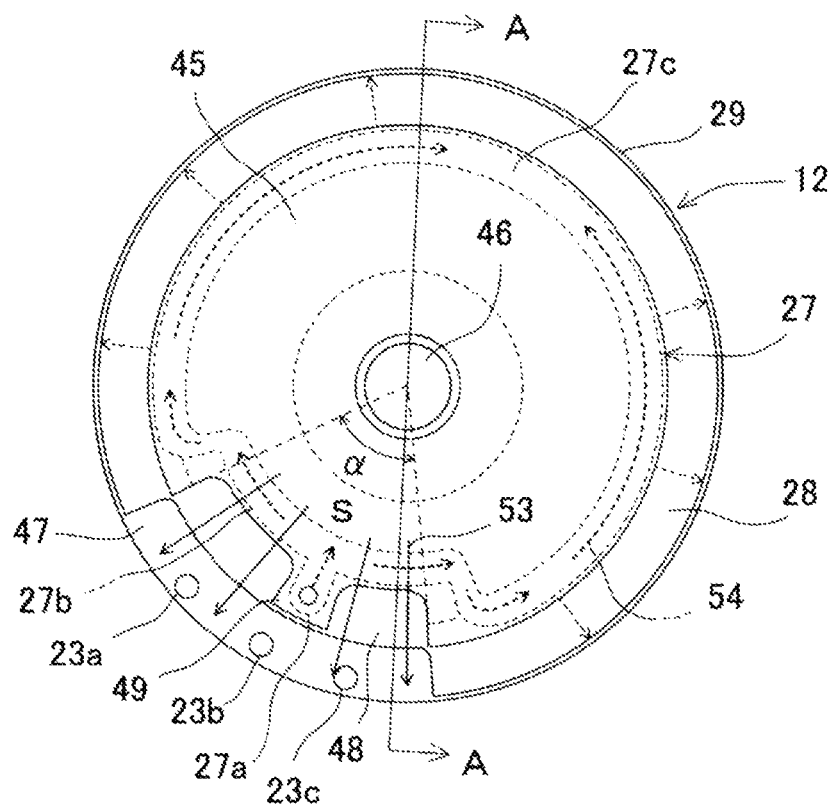
FIG. 4A is a plan view showing the protective plate used in the substrate processing apparatus.

Hereinafter, the structure of the protective plate 12 for intensively supplying the first purge gas 53 to the bases of the nozzles 23a to 23c and supplying the second purge gas 54 to the other portions will be described with reference to FIGS. 3A and 3B and FIGS. 4A and 4B. In FIGS. 3A, 3B and 4A, the flow of the first purge gas 53 is indicated by a solid arrow, and the flow of the second purge gas 54 is indicated by a broken arrow. In FIGS. 3A, 3B, 4A and 4B, the nozzles 23a to 23c (installation positions of the nozzles 23a to 23c) are shown as holes for the sake of convenience.

Figure 4B:
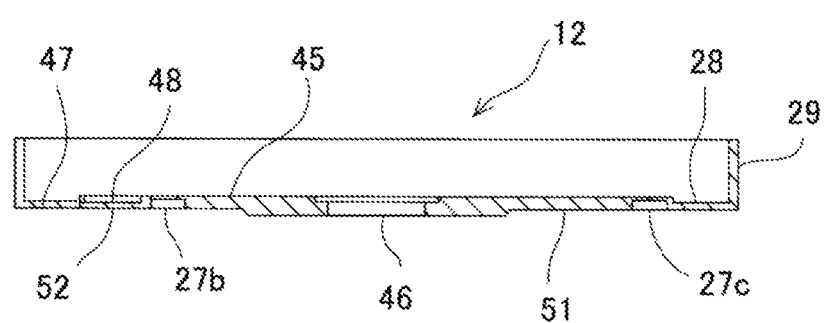
FIG. 4B is a view taken along line A-A in FIG. 4A.

As shown in FIGS. 3A and 4B, a thick portion 45, a first thin portion 28, a second thin portion 47, and a third thin portion 48 are formed in the surface of the protective plate 12. The thick portion 45 has substantially a circular shape with its portion cut away, and a hole 46 through which the heat-insulating plate support pillar 42 is inserted is formed in the center portion of the thick portion 45. The thick portion 45, the first thin portion 28, the second thin portion 47, and the third thin portion 48 form a disc portion having a disc shape.

The first thin portion 28 is formed on the outer peripheral side of the thick portion 45. The thickness of the first thin portion 28 is smaller than that of the thick portion 45, and has an annular shape with its portion cut away. Further, the side wall portion 29 is formed continuously and perpendicularly to the outer peripheral end of the first thin portion 28. A portion where the first thin portion 28 is cut away corresponds to the second thin portion 47 having a thickness smaller than that of the first thin portion 28. In order to avoid contact with the nozzles 23a to 23c, the second thin portion 47 is formed at a location corresponding to its installation position (the bases of the nozzles 23a to 23c and their peripheral portions). The side wall portion 29 is not formed at the outer peripheral end of the second thin portion 47.

A portion where the thick portion 45 is cut away corresponds to the third thin portion 48 having a thickness smaller than that of the thick portion 45 and having the same or substantially the same thickness as the first thin portion 28. The third thin portion 48 is continuous to the inner side in the radial direction of the second thin portion 47 and is an arc-shaped portion that is concentric with the second thin portion 47 and has a predetermined width. In addition, specifically, the thickness of the third thin portion 48 is configured to be greater than the thickness of the second thin portion 47. With this configuration, the flow path resistance from the center side of the protective plate 12 toward the nozzles 23a to 23c can be reduced. That is, it is possible to increase the gas supply amount from the center side of the protective plate 12 toward the nozzles 23a to 23c.

In addition, the outer diameter of the bottom plate 40 is smaller than the outer diameter of the thick portion 45, and the position of the inner peripheral end of the third thin portion 48 is closer to the center of the bottom plate 40 than the inner peripheral end of the bottom plate 40. Accordingly, since the gap 41 larger than a gap between the bottom plate 40 and the thick portion 45 is formed between the bottom plate 40 and the third thin portion 48, the flow path resistance is smaller in the gap 41 than in the gap between the bottom plate 40 and the thick portion 45. Therefore, as shown in FIGS. 3A and 4A, most of the first purge gas 53 that descends along the inner peripheral surface of the cylindrical body 39 is supplied below the nozzles 23a to 23c through the third thin portion 48 to purge the bases and peripheral portions of the nozzles 23a to 23c.

A region formed by connecting both ends of a region where the concentration of the precursor gas and the reaction gas is high and the first purge gas 53 needs to flow intensively and the center of the protective plate 12 is a sectorial region S, and the second thin portion 47 and the third thin portion 48 are located in the sectorial region S. The central angle (open angle) α of the sectorial region S is, for example, 60° and is appropriately set within a range of 0°<α<120° according to the number of nozzles installed or the like. When the central angle α exceeds 120°, the process gas concentration may exceed the critical value, and there is a possibility that by-products may adhere to the process vessel 7, which is not preferable.

The thick portion 45 is formed with a protruding portion 49 that protrudes radially outward from the boundary with the third thin portion 48 (the inner peripheral end of the third thin portion 48) to the outer peripheral end of the third thin portion 48. The position where the protruding portion 49 is formed is, for example, a position facing the exhaust port 26 (the opposite side of the exhaust port 26). A height of the upper surface of the protruding portion 49 is the same as a height of the inside of the thin portion.

As shown in FIG. 3B, a groove 27 having a predetermined width and a predetermined depth (hereinafter referred to as a "second purge gas flow path") is engraved in the back surfaces of the thick portion 45 and the protruding portion 49 along the outer peripheral ends of the thick portion 45 and the protruding portion 49. The second purge gas flow path 27 includes a first flow path 27a extending from the distal end of the protruding portion 49 in the central direction, a second flow path 27b that branches from the proximal end of the protruding portion 49, is curved in the circumferential direction and extends along the inner peripheral end of the third thin portion 48, and a third flow path 27c having an annular shape that is curved outward in the side end of the third thin portion 48 in the radial direction, is further curved in the circumferential direction along the outer peripheral end of the thick portion 45, extends along the outer peripheral end of the thick portion 45 and is continuous with the second flow path 27b.

A stepped portion 52 having a decreasing thickness is formed on the back surface of the protective plate 12 on the outer peripheral side (the back surfaces of the first thin portion 28, the second thin portion 47 and the third thin portion 48) of the second purge gas flow path 27. Further, the stepped portion 52 is formed to be closer to the outer peripheral end of the disc portion than the groove 27. Accordingly, when the protective plate 12 is installed on the lid 9, a central portion 51 (the back surface of the thick portion 45) closer to the center side than the second purge gas flow path 27 and the upper surface of the lid 9 are in contact with each other, and a slight clearance is formed between the upper surface of the lid 9 and the stepped portion 52.

The gas supply pipe 19g of the second purge gas supplier is in fluid communication with the distal end (outer peripheral side) of the first flow path 27a, and the second purge gas 54 is supplied from the distal end of the first flow path 27a. The second purge gas 54 supplied to the first flow path 27a sequentially flows in the order of the first flow path 27a, the second flow path 27b, and the third flow path 27c. In this operation, the upper surface of the lid 9 and the central portion 51 are in contact with each other, and a slight clearance is formed between the upper surface of the lid 9 and the stepped portion 52. Accordingly, the second purge gas 54 flows out of the clearance in the course of flowing through the first flow path 27a, the second flow path 27b, and the third flow path 27c, flows between the upper surface of the lid 9 and the stepped portion 52 and between the inner peripheral surface of the manifold 5 and the side wall portion 29, and is released to the furnace port while purging. The second purge gas 54 released to the furnace port is exhausted through the exhaust port 26.

In addition, the clearance that communicates the first flow path 27a, the second flow path 27b, and the third flow path 27c to the furnace port has a constant interval on the entire circumference, and allows the purge gas to flow out to the furnace port relatively uniformly in at least the third flow path 27c. On the other hand, in the second flow path 27b, since the clearance length is approximately doubled and the conductance is reduced, the outflow is small. Since the amount of increase of the first purge gas by the third thin portion 48 is larger than the amount of decrease of the outflow, the purge gas supply to the bases of the nozzles 23a to 23c can be enhanced as a result.

Figure 5:
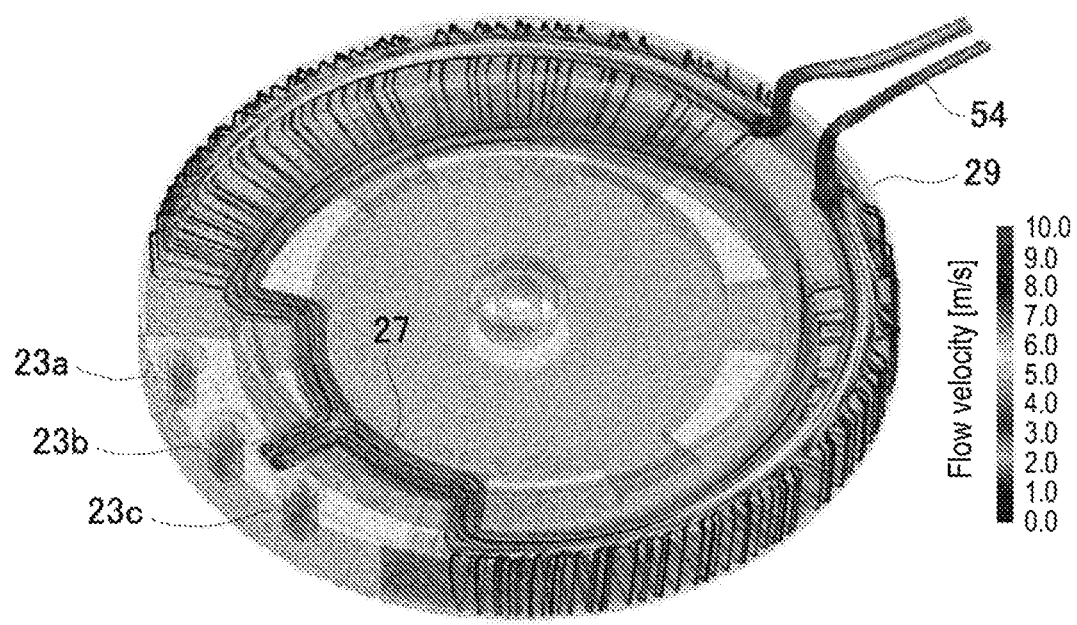
FIG. 5 is an explanatory view showing a flow velocity distribution of a second purge gas in the furnace port.

FIG. 5 shows the flow state of the second purge gas 54 with flow lines when the second purge gas 54 is supplied to the second purge gas flow path 27. As shown in FIG. 5, the second purge gas 54 hardly flows out from the first flow path 27a and the second flow path 27b, flows through the third flow path 27c while flowing out outward in the radial direction, and purges a space between the manifold 5 and the side wall portion 29. Strictly speaking, the amount of outflow of the second purge gas 54 increases as it approaches the nozzles 23a to 23c, and decreases as it approaches the exhaust port 26. Although it is shown in FIG. 5 that there is no flux of the second purge gas 54 in the vicinity of the exhaust port 26, a small amount of second purge gas 54 actually flows.

Figure 7A:
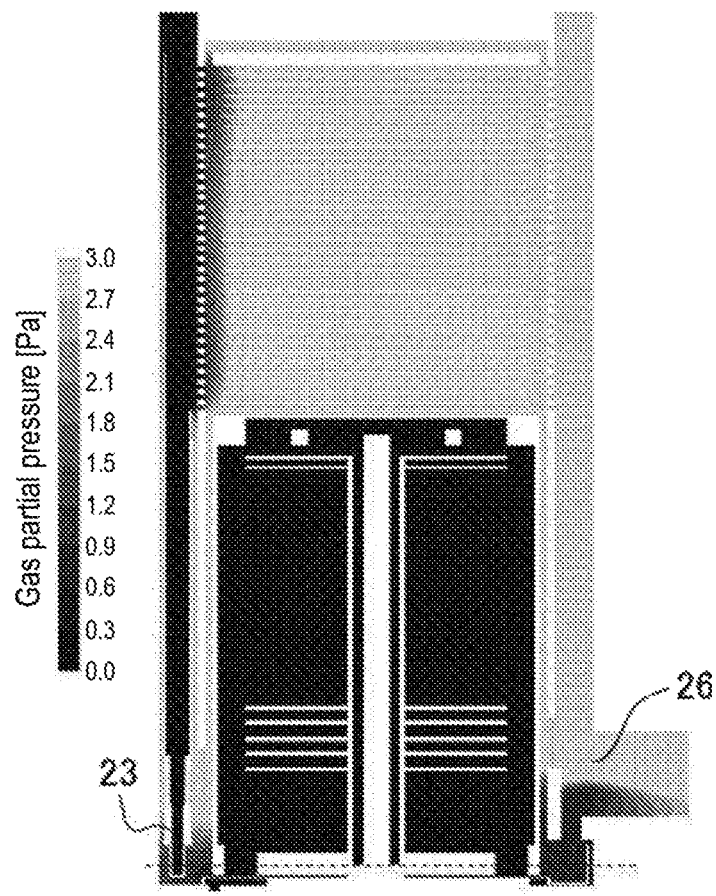
FIG. 7A is a vertical cross sectional view showing a process gas concentration distribution in the furnace port of the first embodiments.
Figure 7B:
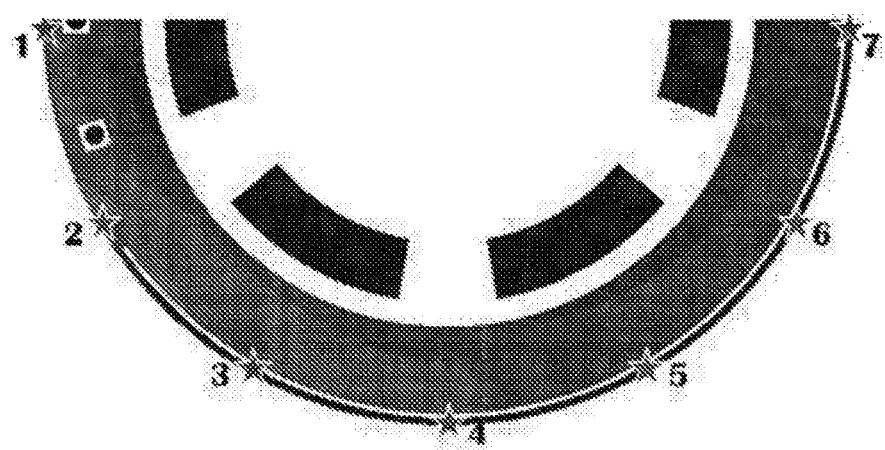
FIG. 7B is a cross sectional view showing the process gas concentration distribution in the furnace port of the first embodiments.

FIGS. 7A and 7B show the process gas concentration (gas partial pressure) distribution in the furnace port in the structure for intensively supplying the first purge gas 53 to the bases of the nozzles 23a to 23c and supplying the second purge gas 54 to the other portions, according to the first embodiments. As shown in FIGS. 7A and 7B, in the case of the configuration of the first embodiments, it can be seen that the process gas concentration in the furnace port is reduced over the entire region, and in particular, the process gas concentration is remarkably reduced in the bases and peripheral portions (the vicinity of a first measurement point and a second measurement point) of the nozzles 23a to 23c.

FIG. 8 is a graph showing a comparison between results of measurement on gas partial pressure at the first to seventh measurement points shown in FIGS. 6B and 7B. In FIG. 8, a solid line indicates the process gas concentration distribution of the reference structure, and a broken line indicates the process gas concentration distribution of the structure of the first embodiments.

As can be seen from FIG. 8, in the structure of the first embodiments, in the bases and peripheral portions (the vicinity of the first measurement point and the second measurement point) of the nozzles 23a to 23c to which the first purge gas 53 is intensively supplied, the process gas concentration is reduced to about ½ of that in the reference structure. As can be further seen, in the portions (the third to seventh measurement points) where the side wall portion 29 is formed and the second purge gas 54 is supplied between the side wall portion 29 and the manifold 5 through the second purge gas flow path 27, the process gas concentration is reduced to ¼ or less of that in the reference structure.

Next, a process of forming a film on a substrate using the above-described processing apparatus 1 (film-forming process) will be described. Here, examples of forming a silicon oxide ($SiO_2$) film on wafers W by supplying a DCS ($SiH_2Cl_2$: dichlorosilane) gas as a precursor gas and an $O_2$ (oxygen) gas as a reaction gas to the wafers W will be described. In the following description, the operation of each of the parts constituting the processing apparatus 1 is controlled by the controller 36.

(Wafer Charging and Boat Loading)

When a plurality of wafers W are charged into the boat 14 (wafer charging), the boat 14 is loaded into the process chamber 8 by the boat elevator 17 (boat loading), and the lower portion of the reaction tube 2 is hermetically closed (sealed) by the lid 9. In this operation, a $N_2$ gas as the first purge gas 53 is supplied from the first purge gas supplier to the bases of the nozzles 23a to 23c through the gap 41. Further, a $N_2$ gas as the second purge gas 54 is supplied from the second purge gas supplier between the side wall portion 29 and the manifold 5 through the second purge gas flow path 27. The supply of the first purge gas 53 and the second purge gas 54 is continued at least until the film-forming process is completed.

(Pressure Adjusting and Temperature Adjusting)

The process chamber 8 is vacuum-exhausted (depressurization-exhausted) by the vacuum pump 35 so that the internal pressure of the process chamber 8 reaches a predetermined pressure (degree of vacuum). The internal pressure of the process chamber 8 is measured by the pressure sensor 33, and the APC valve 34 is feedback-controlled based on the measured pressure information. Further, the wafers W in the process chamber 8 are heated by the heater 3 so as to reach a predetermined temperature. In this operation, the supply of power to the heater 3 is feedback-controlled based on the temperature information detected by the temperature detector 4 so that the process chamber 8 has a predetermined temperature distribution. Further, the rotation of the boat 14 and the wafers W by the rotation mechanism 16 is started.

(Film-Forming Process)

[Precursor Gas Supplying]

When the internal temperature of the process chamber 8 is stabilized at a preset processing temperature, the DCS gas is supplied to the wafers W in the process chamber 8. A DCS gas is controlled so as to have a desired flow rate by the MFC 21a, and is supplied into the process chamber 8 through the gas supply pipe 19a and the nozzle 23a. In this operation, a $N_2$ gas is supplied from the first purge gas supplier and the second purge gas supplier to the furnace port. As a result, the bases and peripheral portions of the nozzles 23a to 23c can be intensively purged with the first purge gas 53, and the other portions can be purged with the second purge gas 54, to dilute the precursor gas concentration in the furnace port. In this operation, the supply of $N_2$ gas by the first purge gas supplier and the second purge gas supplier may be temporarily increased.

[Precursor Gas Exhausting]

Next, the supply of DCS gas is stopped, and the interior of the process chamber 8 is vacuum-exhausted by the vacuum pump 35. In this operation, a $N_2$ gas as an inert gas may be supplied from the inert gas supplier into the process chamber 8 (inert gas purge).

[Reaction Gas Supplying]

Next, an $O_2$ gas is supplied to the wafers W in the process chamber 8. The $O_2$ gas is controlled to have a desired flow rate by the MFC 21b, and is supplied into the process chamber 8 through the gas supply pipe 19b and the nozzle 23b. In this operation, a $N_2$ gas is supplied from the first purge gas supplier and the second purge gas supplier to the furnace port. As a result, the bases and peripheral portions of the nozzles 23a to 23c can be purged intensively, and other portions can also be purged, to dilute the reaction gas concentration in the furnace port.

[Reaction Gas Exhausting]

Next, the supply of $O_2$ gas is stopped, and the interior of the process chamber 8 is vacuum-exhausted by the vacuum pump 35. In this operation, a $N_2$ gas may be supplied from the inert gas supplier into the process chamber 8 (inert gas purge).

By performing a cycle of performing the above-described four steps a predetermined number of times (once or more), a $SiO_2$ film having a predetermined composition and a predetermined film thickness can be formed on each of the wafers W.

(Boat Unloading and Wafer Discharging)

After the film having the predetermined film thickness is formed, a $N_2$ gas is supplied from the inert gas supplier to replace the interior of the process chamber 8 with the $N_2$ gas, and the internal pressure of the process chamber 8 is returned to the normal pressure. Thereafter, the lid 9 is lowered by the boat elevator 17 and the boat 14 is unloaded from the reaction tube 2 (boat unloading). Thereafter, the processed wafers W are taken out from the boat 14 (wafer discharging).

The processing conditions for forming the $SiO_2$ film on the wafers W may be exemplified as follows.

Processing temperature (wafer temperature): 300 degrees C. to 700 degrees C.

Processing pressure (process chamber internal pressure): 1 Pa to 4,000 Pa

DCS gas: 100 sccm to 10,000 sccm

O2 gas: 100 sccm to 10,000 sccm

N2 gas: 100 sccm to 10,000 sccm

By setting the respective processing conditions to values within the respective ranges, the film-forming process can be appropriately advanced.

As described above, in the first embodiments, the third thin portion 48 is formed in the portion of the thick portion 45 facing the nozzles 23a to 23c, and the second thin portion 47 is formed in the bases and peripheral portions of the nozzles 23a to 23c of the first thin portion 28.

Accordingly, the gap 41 formed between the heat-insulating structure 15 and the protective plate 12 has a large opening area in the direction from the center of the protective plate 12 toward the nozzles 23a to 23c. That is, since the flow path resistance when passing through the gap 41 is reduced, most of the first purge gas 53 in the heat-insulating structure 15 passes through the third thin portion 48. In addition, since the second thin portion 47 is thinner than the first thin portion 28, the first purge gas 53 that has passed through the third thin portion 48 is supplied to the bases and peripheral portions of the nozzles 23a to 23c without spreading in the circumferential direction.

Accordingly, the process gas concentration in the bases and peripheral portions of the nozzles 23a to 23c can be reduced to suppress adhesion of by-products. As a result, it is possible to suppress generation of particles and thus improve productivity.

In the first embodiments, the protective plate 12 is disposed in a manner such that the second purge gas flow path 27 is formed in the back surface of the protective plate 12, the side wall portion 29 erected vertically is formed at the outer peripheral end of the protective plate 12, and predetermined gaps are formed between the protective plate 12 and the lid 9 and between the side wall portion 29 and the manifold 5.

Accordingly, the second purge gas 54 supplied to the second purge gas flow path 27 is released to the furnace port through the gaps between the protective plate 12 and the lid 9 and between the side wall portion 29 and the manifold 5. By forming the side wall portion 29, since the flow path sectional area of the second purge gas 54 can be reduced, the inner peripheral surface of the manifold 5 can be sufficiently purged while suppressing the supply amount of the second purge gas 54, and the process gas concentration can be greatly reduced. As a result, it is possible to suppress adhesion of by-products to the inner peripheral surface of the manifold 5 and generation of particles and thus improve productivity.

In addition, since the supply amount of the second purge gas 54 can be suppressed, it is not necessary to increase the total flow rate of the purge gas more than necessary. Accordingly, it is possible to suppress an adverse effect on the wafer processing due to the purge gas and thus improve the quality of film formation.

Further, since the second purge gas 54 is supplied from the first flow path 27a protruding toward the nozzles 23a to 23c, the amount of outflow of the second purge gas 54 from the second purge gas flow path 27 increases as it approaches the nozzles 23a to 23c side (see FIG. 5). That is, since a larger amount of the second purge gas 54 is supplied to the nozzles 23a to 23c side having a higher process gas concentration, the second purge gas 54 can be efficiently supplied in accordance with the process gas concentration distribution.

The embodiments of the present disclosure have been specifically described above. However, the present disclosure is not limited to the above-described embodiments, but various modifications can be made without departing from the gist of the present disclosure.

Figure 9A:
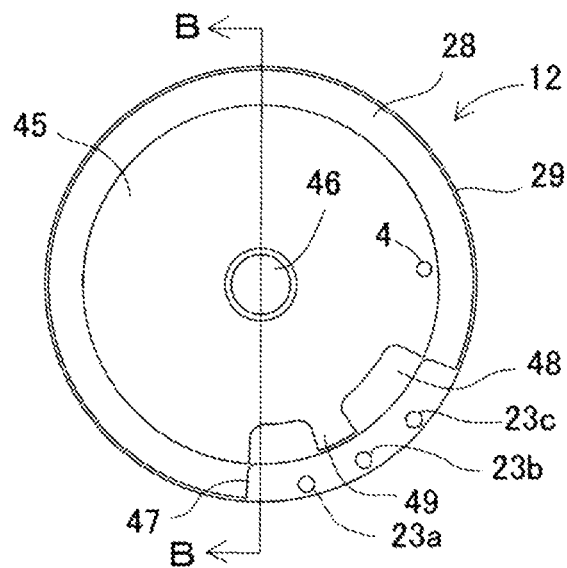
FIG. 9A is a plan view showing a protective plate used in a substrate processing apparatus according to second embodiments of the present disclosure.

Next, second embodiments of the present disclosure will be described with reference to FIGS. 9A to 9C. The second embodiments may include installing the temperature detector 4 through the lid 9 and the protective plate 12 from below.

Figure 9B:
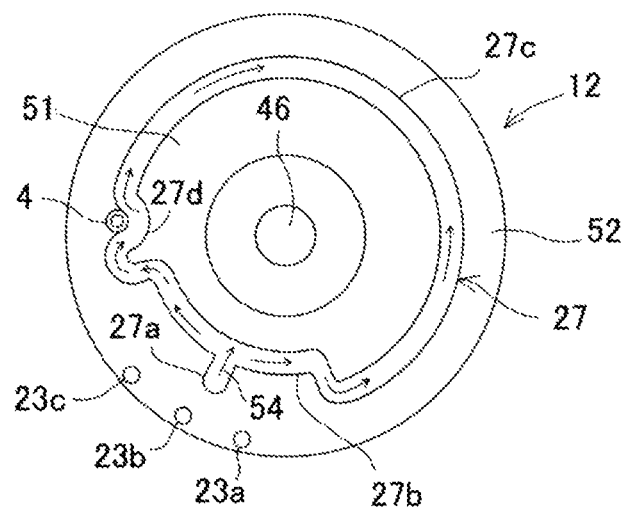
FIG. 9B is a bottom view showing the protective plate.
Figure 9C:
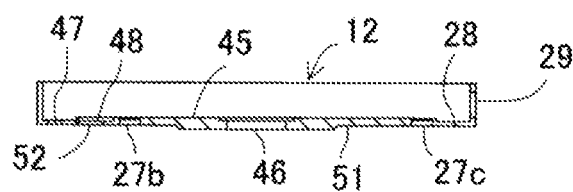
FIG. 9C is a view taken along line B-B in FIG. 9A

When installing the temperature detector 4 from below, as shown in FIG. 9B, the installation position of the temperature detector 4 is in the second purge gas flow path 27 (third flow path 27c) formed in the back surface of the protective plate 12.

Therefore, in the second embodiments, a detour flow path 27d is formed by bending the third flow path 27c in a semicircular shape so as to detour the temperature detector 4 from the center side. An introduction hole of the temperature detector 4 installed in the lid 9 may be purged in order to maintain the sealing performance. The introduction hole is in fluid communication with the detour flow path 27d, and when the second purge gas 54 flows through the detour flow path 27d, the periphery of the introduction hole can be purged.

In the second embodiments, as in the first embodiments, the first purge gas 53 can be intensively supplied to the bases and peripheral portions of the nozzles 23a to 23c, and the second purge gas 54 flowing out from the third flow path 27c can purge the gaps between the lid 9 and the stepped portion 52 and between the manifold 5 and the side wall portion 29.

In the first and second embodiments, the second purge gas flow path (second flow path 27b) is formed so as to avoid the third thin portion 48. However, if a sufficient thickness can be secured in the third thin portion 48, the second purge gas flow path may be formed in a circular shape with a certain radius without avoiding the third thin portion 48.

The examples in which the DCS gas is used as the precursor gas have been described in the above-described first and second embodiments. However, the present disclosure is not limited to such embodiments. For example, as the precursor gas, it may be possible to use, for example, an inorganic halosilane precursor gas such as a HCDS ($Si_2Cl_6$: hexachlorodisilane) gas, a MCS ($SiH_3Cl$: monochlorosilane) gas or a TCS ($SiHCl_3$: trichlorosilane) gas, or the like, a halogen-group-free amino-based (amine-based) silane precursor gas such as a 3DMAS ($Si[N(CH_3)_2]_3H$: trisdimethylaminosilane) gas or a BTBAS ($SiH_2[NH(C_4H_9)]_2$: bistertiarybutylaminosilane) gas, or the like, or a halogen-group-free inorganic silane precursor gas such as a MS ($SiH_4$: monosilane) gas or a DS ($Si_2H_6$: disilane) gas, or the like, as well as the DCS gas.

The examples in which the $SiO_2$ film is formed have been described in the above-described embodiments. However, the present disclosure is not limited to such embodiments. Alternatively or in addition to these, they may be possible to form, for example, a SiN film, a SiON film, a SiOCN film, a SiOC film, a SiCN film, a SiBN film, or a SiBCN film, or the like using a nitrogen (N)-containing gas (nitriding gas) such as an ammonia ($NH_3$) gas or the like, a carbon (C)-containing gas such as a propylene ($C_3H_6$) gas or the like, or a boron (B)-containing gas such as a boron trichloride ($BCl_3$) gas or the like. Even when these films are formed, the film formation can be performed under the same processing conditions as in the above-described embodiments, and the same effects as in the above-described embodiments can be obtained.

The present disclosure can be suitably applied to cases of forming a film which contains metal element such as titanium (Ti), zirconium (Zr), hafnium (Hf), tantalum (Ta), niobium (Nb), aluminum (Al), molybdenum (Mo), tungsten (W), or the like, that is, a metal-based film, on a wafer W.

The present disclosure can be applied to an apparatus for processing a semiconductor substrate or the like under reduced pressure, process gas atmosphere or high temperature, and can be applied to, for example, deposition such as CVD, PVD, ALD, epitaxial growth, or the like, a process for forming an oxide film or a nitride film on a surface, a diffusion process or an etching process.

According to the present disclosure in some embodiments, it is possible to suppress adhesion of by-products and generation of particles and thus improve productivity.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A protective plate installed on a lid comprising:
   a disc portion having a disc shape, wherein at least a part of a lower surface of the disc portion is in contact with an upper surface of the lid;
   a side wall portion extending vertically from an outer peripheral end of the disc portion;
   a groove having a loop shape and formed in the lower surface of the disc portion; and
   a stepped portion formed to be closer to the outer peripheral end of the disc portion than the groove, a predetermined clearance being formed between the upper surface of the lid and the stepped portion,
   wherein the groove is configured to be able to form a flow of a gas that runs through a gap between the lid and the stepped portion, and is supplied to an outside of the side wall portion.

2. The protective plate of claim 1, further comprising a thin portion formed in a part of an outer peripheral end of an upper surface of the protective plate, a gap being wide and partially formed between the thin portion and a member installed close to an upper side of the protective plate,
   wherein a gas supplied into the member intensively flows out from the gap.

3. A substrate processing apparatus comprising:
   a process vessel, in which a substrate to be processed is accommodated, having an opening at a lower end of the process vessel;
   a lid for hermetically closing the opening;
   a substrate holder that holds the substrate in the process vessel;
   a heat-insulating structure installed between the lid and the substrate holder;
   a process gas supplier comprising a nozzle configured to supply a process gas into the process vessel;
   a protective plate installed on an upper surface of the lid;

a first purge gas supplier configured to supply a first purge gas to a base of the nozzle and a peripheral portion of the base through a first gap formed between the heat-insulating structure and the protective plate, the base being located at a lower portion of the process vessel; and a second purge gas supplier configured to supply a second purge gas to at least a portion other than the base of the nozzle and the peripheral portion of the base through a second gap formed between the lid and the protective plate, wherein the protective plate comprises:
   a disc portion having a disc shape, wherein at least a part of a lower surface is in contact with the upper surface of the lid;
   a side wall portion extending vertically from an outer peripheral end of the disc portion;
   a groove having a loop shape and formed in the lower surface of the disc portion; and
   a stepped portion formed to be closer to the outer peripheral end of the disc portion than at least the groove, a predetermined first clearance being formed between the upper surface of the lid and the stepped portion, and wherein the second purge gas supplier is configured to supply the second purge gas to the groove through a gas supply port formed in the lid and to purge an outside of the side wall portion with a predetermined range of flow rate or flow velocity.

4. The substrate processing apparatus of claim 3,
wherein the process vessel comprises:
   a cylindrical reaction tube having a closed upper end; and
   a cylindrical manifold connected to a lower end of the reaction tube, the manifold being shorter than the reaction tube,
wherein the nozzle is attached to the manifold and the reaction tube is closed by the lid with the manifold interposed between the reaction tube and the lid.

5. The substrate processing apparatus of claim 3, wherein the first clearance between the lid and the stepped portion serves as a part of a flow path of the second purge gas,
   the second purge gas supplied to the groove flows radially outward between the lid and the stepped portion,
   a predetermined second clearance is formed between the side wall portion and a manifold, and
   the second clearance between the side wall portion and the manifold serves as a part of the flow path of the second purge gas.

6. The substrate processing apparatus of claim 3, wherein the process vessel comprises an exhaust port connected to a vacuum pump, and the exhaust port is installed on an opposite side of the nozzle.

7. The substrate processing apparatus of claim 3, wherein the side wall portion does not serve as a part of a supply path of the first purge gas supplied from the first purge gas supplier.

8. The substrate processing apparatus of claim 3, wherein the protective plate further comprises a thin portion that is formed in a part of an outer peripheral end of an upper surface of the protective plate, a third gap being wide and partially formed between the heat-insulating structure and the thin portion.

9. The substrate processing apparatus of claim 8, wherein a protruding portion is formed in the upper surface of the protective plate so as to protrude from an inner peripheral end to an outer peripheral end of the thin portion, a height of the protruding portion is the same as a height of an inside of the thin portion, and the gas supply port is installed on a back surface of the protruding portion.

10. A method of manufacturing a semiconductor device using a substrate processing apparatus, comprising:
   closing hermetically an opening of a cylindrical reaction tube formed in a lower end of the reaction tube with a lid on which a protective plate is installed, the protective plate comprising:
      a disc portion having a disc shape, wherein at least a part of a lower surface of the disc portion of the protective plate having a disc shape is in contact with an upper surface of the lid;
      a side wall portion extending vertically from an outer peripheral end of the disc portion;
      a groove having a loop shape and formed in the lower surface of the disc portion; and
      a stepped portion formed to be closer to the outer peripheral end of the disc portion than the groove, a predetermined clearance being formed between the upper surface of the lid and the stepped portion,
   supplying a gas from a supply port formed in the lid to the groove, and
   forming a flow of the gas running through a gap between the lid and the stepped portion, and then supplied to an outside of the side wall portion.

* * * * *